INVENTORS
Russell K. Long
Jack P. Mize

INVENTORS
Russell K. Long
Jack P. Mize

Nov. 21, 1967 R. K. LONG ET AL 3,354,006

METHOD OF FORMING A DIODE BY USING A MASK AND DIFFUSION

Filed March 1, 1965 3 Sheets-Sheet 3

INVENTORS
Russell K. Long
Jack P. Mize

United States Patent Office 3,354,006
Patented Nov. 21, 1967

3,354,006
METHOD OF FORMING A DIODE BY USING A MASK AND DIFFUSION

Russell K. Long, Mountain View, Calif., and Jack P. Mize, Riviera Beach, Fla., assignors to Texas Instruments Incorporated, Dallas, Tex., a corporation of Delaware Filed Mar. 1, 1965, Ser. No. 436,393
6 Claims. (Cl. 148—187)

ABSTRACT OF THE DISCLOSURE

Disclosed is a method of forming a Zener regulator diode in a low resistivity P conductivity-type substrate by diffusing P conductivity-type impurities into one surface of the substrate to form a P+ conductivity-type region, followed by a localized diffusion through an opening in an oxide mask to form an N conductivity-type region within the P+ conductivity-type region. The breakdown voltage of the diode can then be varied by a further diffusion treatment which changes the surface impurity concentration of the P+ conductivity-type region.

This invention relates to semiconductor devices and in particular relates to those devices classified as Zener diodes.

The Zener or voltage regulator diode is essentially a P-N junction operated in a reverse bias condition. The reverse bias breakdown voltage referred to as the Zener or breakdown voltage, being the voltage drop across the diode, becomes essentially constant for a wide range of currents. This voltage limiting action provides a constant voltage reference or control element and thereby finds extensive use in circuit synthesis. Voltage tolerances of the breakdown voltage are usually specified commercially within the limits of ±5%, ±10% or ±20% in the range of 2.4 to 200 volts. The expression "Zener breakdown voltage" is used somewhat loosely in that the breakdown mechanism above about 6 volts is thought to be due to avalanching and that below 6 volts is thought to be due essentially to tunnelling.

The electrical breakdown of a P-N junction is referred to as "avalanche breakdown" when the electric field across the barrier region is large enough to produce ionization by collisions of current carriers traversing the barrier region with electrons in the valence band. Tunnelling is the phenomenon wherein a particle effectively disappears from one side of a potential barrier and appears on the other side of the barrier although the particle does not have sufficient energy to surmount the barrier. In the case of certain P-N junctions, the depletion region is such a barrier and tunnelling may occur when it is narrow.

Voltage regulator diodes are frequently specified in power ratings of 0.4, 1, 10 or 50 watts. In the fabrication of the diodes, the power rating will determine the configuration used since efficient thermal dissipation is required, particularly in the higher voltage and high wattage devices.

In a conventional Zener diode the voltage at which breakdown occurs is determined by the impurity concentration of the substrate and the impurity concentration gradient through the diffused or alloyed regions of the diode. Thus the fabrication of the voltage regulator diode is essentially an exercise in forming a P-N junction and the precise control of the impurity profile.

One desirable feature in the manufacture of the Zener diodes is the ability to obtain a very narrow distribution of breakdown voltages of a large number of diodes in any one production run. The narrow distribution will reduce the manufacturing costs by increasing the yields.

It is therefore one object of the invention to provide a method of making a new and improved Zener diode.

Another object is to present a method of making a diode in which the breakdown voltage may be accurately determined.

Still another object of the invention is to present a design which results in a new and improved voltage regulator diode.

Other objects and features of the invention will become apparent from the following detailed description taken in conjunction with the appended claims and the attached drawings, in which:

Figure 1:
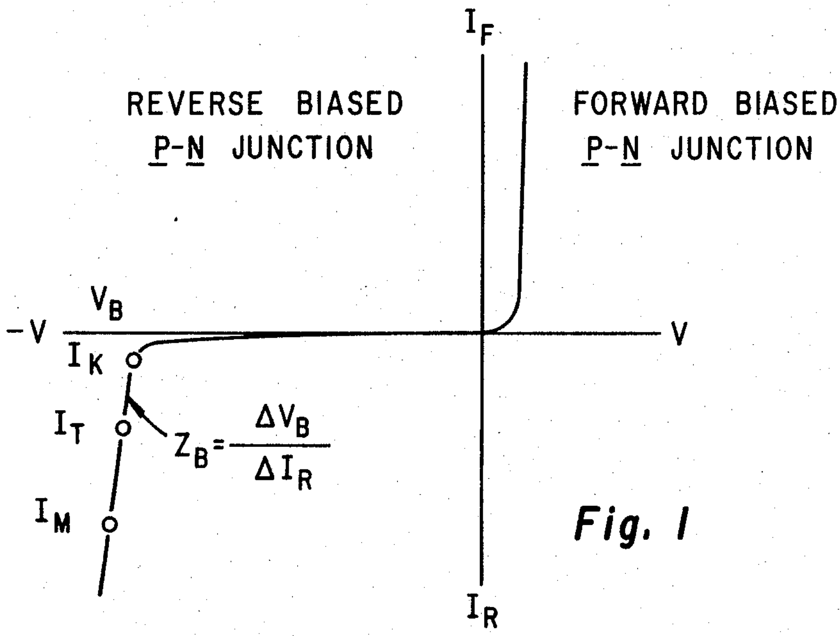
FIGURE 1 is a graph which illustrates the characteristics of a voltage regulator diode when biased alternately in the forward direction and in the reverse direction.

Referring to FIGURE 1 there is shown the forward and reverse bias conditions of a voltage regulator diode. In the forward bias position the device performs similarly to an ordinary diode; it is in the reverse bias condition in which the breakdown action takes place. Several points $I_K$, $I_T$ and $I_M$, are indicated on the curve to identify the various aspects to be considered in the design. The point $I_K$ is the minimum current required to establish the Zener or breakdown plateau. $I_T$ is the test current point and $I_M$ is the maximum allowable reverse current. The breakdown voltage, $V_B$, is the voltage at which the device breaks down as the bias voltage is applied in the reverse direction. $Z_B$ is the Zener impedance which is equivalent to $$\frac{\Delta V_B}{\Delta I_R}$$

$I_R$ representing the reverse current $Z_B$ is usually established by superimposing on a D.C. voltage across the device which produces $I_T$, a 60–1000 cycle A.C. voltage which develops an RMS value of ±10% $I_T$. Although it is necessary that $Z_B$ be greater than zero it is desirable that it be as small as possible and in practice it is about 17 ohms for a diode having a $V_B$=10 volts.

Figures 2, 3:
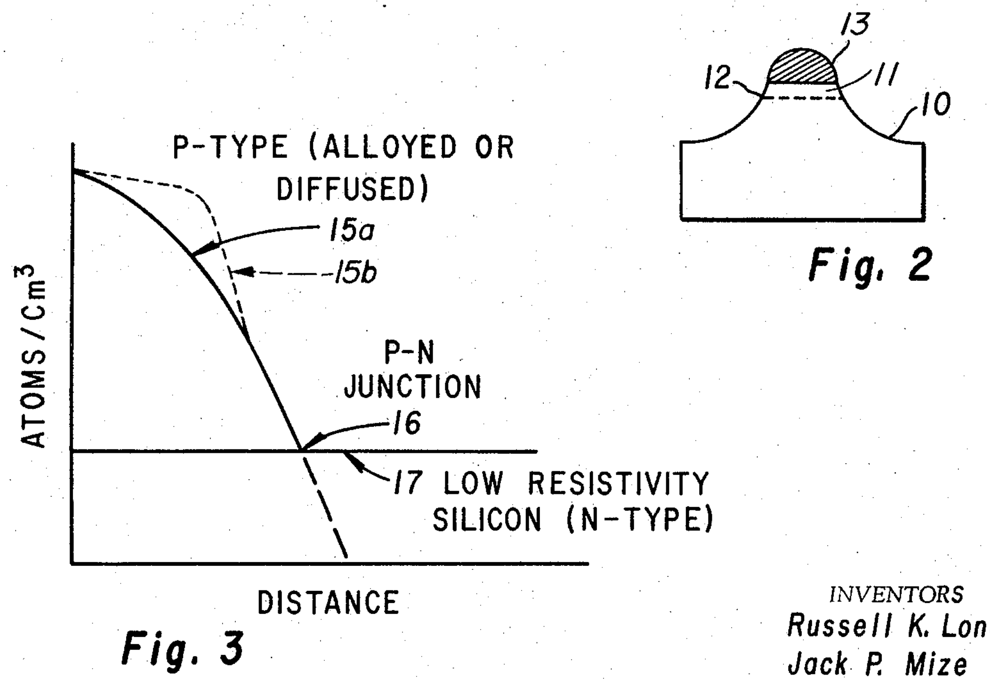
FIGURE 2 is a cross-section of a voltage regulator diode as commonly manufactured in industry.
FIGURE 3 is a graph showing the impurity concentration distribution of the device shown in FIGURE 2.

In the design of voltage regulator diodes, it is necessary that the method used yields the desired reverse I–V characteristics. FIGURE 2 is a cross-sectional view of a voltage regulator diode as commonly constructed and FIGURE 3 is an impurity profile of the diode of FIGURE 2. Basically the diode has a low resistivity silicon substrate, for example, N-type material that has a P conductivity-type region formed therein. This P conductivity-type region may be formed either by alloying or diffusion. After the P conductivity-type region is formed, the junction is chemically etched to form a mesa type structure. FIGURE 2 shows a low resistivity silicon N conductivity-type substrate 10 having a P conductivity-type region 11 therein. The substrate 10, including the region 11, is chemically etched to form the mesa type configuration shown. Contact 13, which may be for example aluminum, plays a dual part, being used as a contact and providing the P-type impurity needed to form the junction.

Referring to the profile curve in FIGURE 3, it may be observed that there is a high impurity concentration at the surface of the mesa, the upper point on the vertical axis being the surface concentration of the P conductivity-type region. Extending downward, the concentration decreases with distance from the surface of the mesa until the low resistivity N conductivity-type silicon wafer is reached, at which time the resistivity levels out due to the pre-selected concentration in the wafer. Curves 15a and 15b are plots of the impurity gradients of the P conductivity-type region, curve 15a representing a region formed by diffusion and curve 15b representing a region formed by alloying. The curves extend downward and intersect line 17, which represents the resistivity (impurity concentration) of the N conductivity-type silicon substrate. The intersection 16 represents the P-N junction. If the resistivity of the substrate, designated by the line 17, were to vary, the junction point 16 would correspondingly vary, thereby changing the breakdown voltage.

Figure 6:
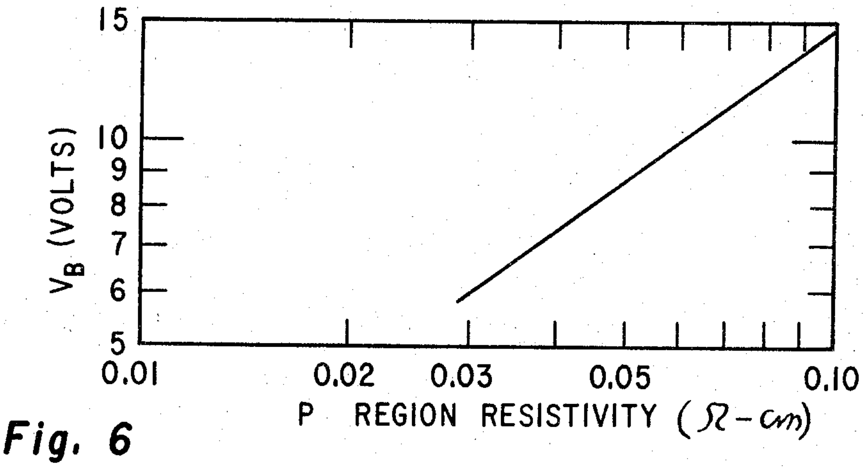
FIGURE 6 is a graph showing the breakdown voltage vs. resistivity of the P+ conductivity-type region of the device shown in FIGURE 2.

In the design of the device shown in FIGURE 2, difficulty is experienced in obtaining a bar of silicon for the starting material whose resistivity does not vary throughout its volume by less than 10%. To illustrate the control needed in the starting material, a graph is shown in FIGURE 6, showing the breakdown voltage vs. the P conductivity-type region resistivity. The fabrication of a voltage regulator diode in the range of 6 to 15 volts, for example, with a $\pm 5\%$ $V_B$ tolerance requires that a tolerance of about $\pm 7\%$ be held on the resistivity of the starting material.

Figure 4:
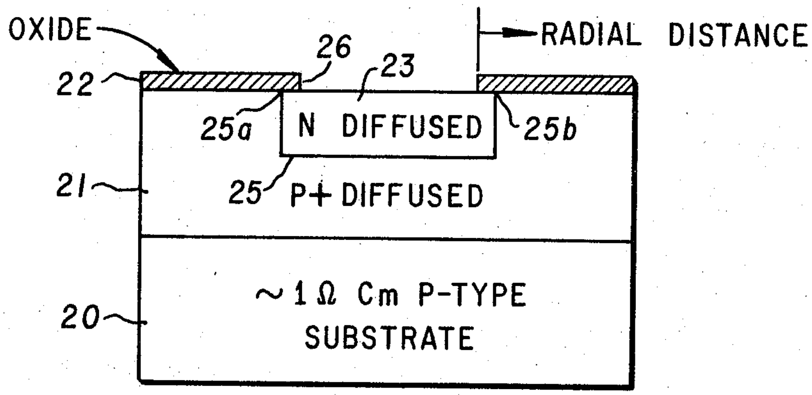
FIGURE 4 is a pictorial view in cross-section which shows a diode device made by the present invention.
Figure 5:
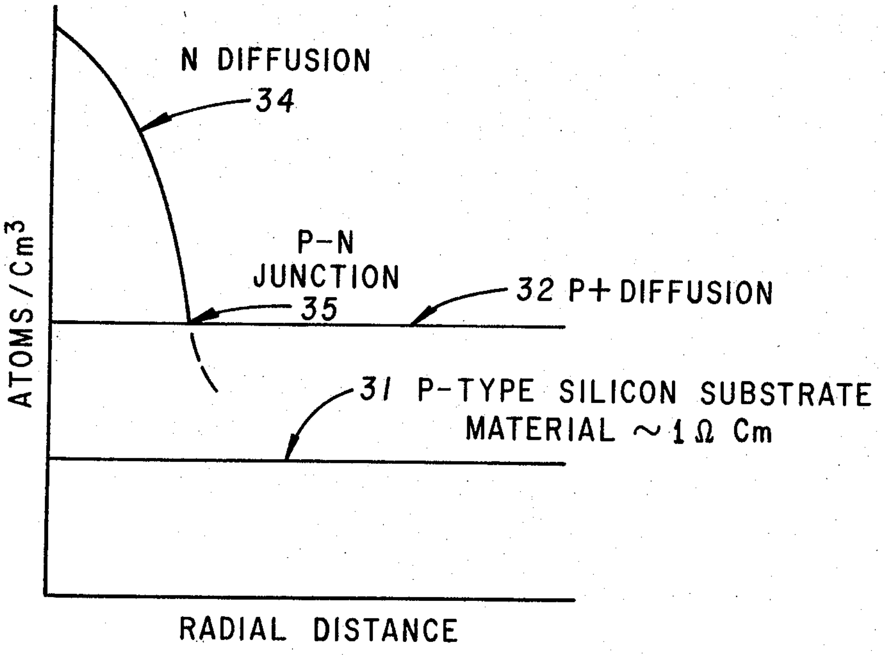
FIGURE 5 is a graph showing the impurity concentration of the device shown in FIGURE 4.

The design used in the present invention is shown in FIGURE 4. This design uses basically a planar double diffused method. A silicon P conductivity-type slice 20, approximately 1 ohm-cm., is used as a substrate. A P conductivity-type is made into the substrate forming the P+ conductivity-type region 21. P+ indicates a P conductivity-type region having a very high impurity concentration. After the P conductivity-type diffusion has been made, the surface of the wafer is masked by any suitable means leaving only an opening 26 therein for a subsequent diffusion. This mask is represented by the oxide 22 on top of the wafer. An N conductivity-type diffusion is then made through the opening 26 in the mask on top of the wafer to form the N conductivity-type region 23. The interface between the N conductivity-type region 23 and the P+ conductivity-type region 21 constitutes the P-N junction 25. Since the N conductivity-type region 23 is planar, the junction 25 extends to the surface of the wafer as indicated at 25a and 25b. The result of this method of forming the P-N junction is shown in FIGURE 5 which is an impurity profile of the device shown in FIGURE 4. The line 31 represents the impurity concentration of the substrate 20. Line 32 represents the impurity concentration of the diffused P+ conductivity-type region and line 34 represents the impurity gradient on the surface of the N conductivity-type region from the edge of the opening 26 in the oxide 22 to the P-N junction indicated by 25a or 25b. It may be observed (FIGURE 5) that the initial impurity concentration of the substrate does not enter into the formation of the P-N junction since the diffusion of the P+ conductivity-type region 21 of FIGURE 4 can be quite accurately controlled. The impurity concentration of the P+ conductivity-type region at the P-N junction may be determined in advance, therefore the impurity concentration of the P+ conductivity-type region, represented by line 32, may be controlled to close tolerances, thus permitting the determination of the P-N junction point which in turn permits prediction of the breakdown voltage to an accurate degree. The method described makes it possible to obtain a particular breakdown voltage by controlling the surface impurity concentration of the P+ conductivity-type region and the impurity concentration gradient of the N conductivity-type region at the surface intersection of the P-N junction. After the desired breakdown voltage is obtained, a new value of breakdown voltage may be obtained by a third diffusion step which changes the surface concentration of the P+ conductivity-type region, thus changing the P-N junction point 35 on the atoms/cm.$^3$ axis of FIGURE 5. The third diffusion step is accomplished by maintaining the diode at a sufficient temperature to further diffuse the P conductivity-type impurities away from the surface of the P+ conductivity-type region.

A specific example of the method used in manufacturing the voltage regulator diode is as follows: Silicon substrate 20 is placed in a chamber suitable for making diffusions. Boron, for example, or some other P conductivity-type impurity is diffused into one surface of the substrate to form the P+ conductive-type region 21. Thereafter, the substrate is oxidized to form oxide layer 22. An opening 26 is made in the oxide to expose the surface of the P+ conductivity-type region 21 and then an N conductivity-type impurity, for example, phosphorus is diffused into the P+ conductivity-type region 21 to form the N conductivity-type region 23. Contacts (not shown) may then be formed and the device encapsulated.

Figure 7:
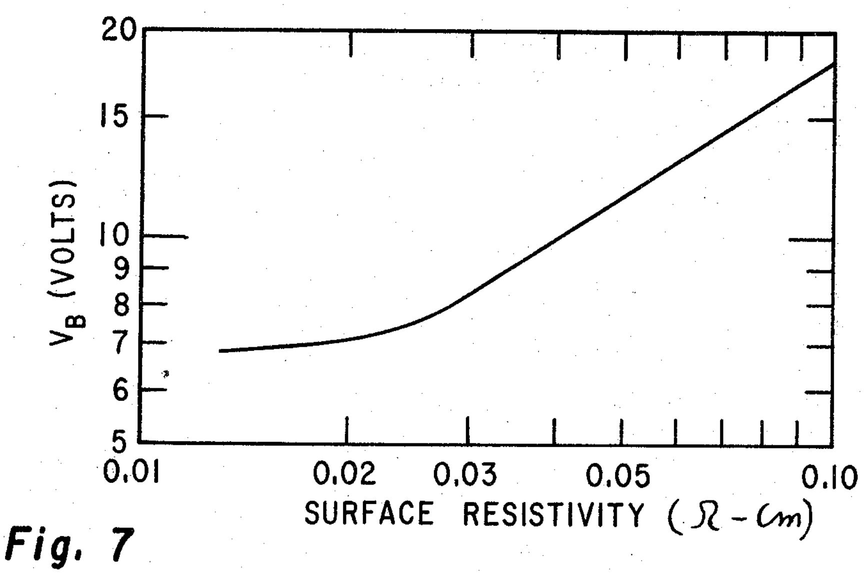
FIGURE 7 is a graph showing the breakdown voltage vs. surface resistivity of the P+ conductivity-type region of the device shown in FIGURE 4.

In determining the breakdown voltage, a curve, shown in FIGURE 7, has been plotted using points obtained from experimental data. The curve shows a variation of the junction breakdown voltage between about 6 and about 15 volts as a function of the surface resistivity of the P+ conductivity-type region. Two approximations have been made, (1) that each device has the same N conductivity-type impurity concentration gradient at the P-N junction at the surface and (2) the voltage breakdown occurs at the junction at the surface. The first approximation is valid because the diffusion into N conductivity-type region 23, was almost the same in time and temperature, and the second approximation is valid because the junction occurs at a higher P conductivity-type impurity concentration at the surface than in the bulk. It is therefore possible to obtain a particular breakdown voltage by controlling the surface impurity concentration of the P+ conductivity-type region and the impurity concentration gradient of the N conductivity-type region at the surface intersection of the P-N junction. Therefore, as indicated above, after the desired breakdown voltage is obtained, a new value of breakdown voltage may be obtained by varying only the surface resistivity of the P+ conductivity-type region, that is, varying the diffusion time temperature cycle in a third diffusion step as previously explained. If 10 $\pm 5\%$ volts is desired as the breakdown voltage, for example, the surface resistivity of the P+ conductivity-type region should be about 0.040 $\pm 7\%$ ohm-cm. Because the curve shown in FIGURE 7 becomes less steep below about 10 volts, a greater variation of surface resistivity is allowed for a particular breakdown voltage. For example, if a breakdown voltage of 7 $\pm 5\%$ volts is desired, the surface resistivity needs to be about 0.017 $\pm 35\%$.

From the foregoing it may be seen that the double diffused method of making a Zener diode has many advantages. The advantages of the proposed technique over the single diffused or alloyed etch P-N junction are enhanced control of Zener breakdown voltage with accompanying narrow distribution of breakdown voltages among different diodes, improved stability and reliability through planar oxide stabilized P-N junction formation and reduction of manufacturing prime costs through increased yields and process control inherent in the planar process.

Although the present invention has been shown and illustrated in terms of specific embodiments, it will be apparent that changes and modifications are possible without departing from the spirit and scope of the invention as defined by the appended claims.

What is claimed is:

1. The method af manufacturing a Zener diode comprising the steps of:

(a) diffusing a P conductivity-type impurity into a surface of the P conductivity-type substrate to form a P+ conductivity-type region therein;

(b) masking said surface of said P+ conductivity-type region with an oxide layer;

(c) removing a portion of said oxide layer to expose a portion of said surface of said P+ conductivity-type region; and (d) diffusing an N conductivity-type impurity into said portion of said surface of the diffused P+ conducductivity-type region through said opening in said oxide layer to form an N conductivity-type region therein, the interface between said P+ conductivity-type region and said N conductivity-type region constituting the junction of said Zener diode.

2. The method according to claim 1 wherein said P conductivity-type substrate is silicon.

3. The method of manufacturing a double diffused Zener diode comprising the steps of:

(a) diffusing a P conductivity-type impurity into a surface of a low resistivity P conductivity-type substrate to form a P+ conductvity-type region therein;

(b) forming a layer of oxide over the surface of said P+ conductivity-type region;

(c) removing a portion of said oxide layer to form an opening therein; and (d) diffusing an N conductivity-type impurity through said opening in said oxide layer to form an N conductivity-type region in said diffused P+ conductivity-type region, the interface of said P+ conductivity-type and N conductivity-type diffused regions forming the junction of said Zener diode.

4. The method of manufacturing a Zener diode comprising the steps of:

(a) diffusing an impurity of one conductivity type into a surface of a semiconductor substrate having said one type impurity to form a highly doped region of said one conductivity-type therein;

(b) masking the surface of said highly doped region with an insulating material;

(c) removing a portion of said insulating material to form an opening therein;

(d) diffusing an impurity of opposite conductivity type through said opening in said insulating material to form a region of opposite conductivity-type in said highly doped region of said one conductivity-type; and (e) heating said substrate to a temperature and for a period of time sufficient to change the surface resistivity of said substrate.

5. The method of manufacturing a Zener diode comprising the steps of:

(a) diffusing a P conductivity-type impurity into a surface of a P conductivity-type substrate; to form a P+ conductivity-type region therein;

(b) masking the surface of said P+ conductivity-type region with an oxide layer;

(c) removing a portion of said oxide layer to form an opening therein to expose a portion of said surface of said P+ conductivity-type region;

(d) diffusing an N conductivity-type impurity into said portion of said surface of said P+ conductivity-type region through said opening in said oxide to form an N conductivity-type region therein; and (e) heating said substrate to a temperature and for a period of time sufficient to change the surface sensitivity of said substrate.

6. The method of manufacturing a Zener diode as defined in claim 1 wherein said P conductivity-type substrate has a resistivity of 1 ohm-cm.

References Cited

UNITED STATES PATENTS

| | | | |
|---|---|---|---|
| 2,868,683 | 1/1959 | Jochems | 148—33.5 |
| 2,953,486 | 9/1960 | Atalla | 148—191 |
| 3,085,033 | 1/1963 | Handleman | 148—191 |
| 3,132,408 | 5/1964 | Pell | 148—186 |
| 3,147,152 | 4/1964 | Mendel | 148—186 |
| 3,152,928 | 10/1964 | Hubner | 148—335 |
| 3,183,129 | 5/1965 | Tripp | 148—186 |
| 3,226,614 | 12/1965 | Haenichen | 148—186 |
| 3,249,831 | 5/1966 | New | 317—234 |
| 3,252,062 | 5/1966 | Kooi | 317—234 |

HYLAND BIZOT, *Primary Examiner.*